(12) United States Patent
Tanaka et al.

(10) Patent No.: US 11,496,163 B2
(45) Date of Patent: Nov. 8, 2022

(54) RADIO FREQUENCY CIRCUIT, RADIO FREQUENCY MODULE, AND COMMUNICATION DEVICE

(71) Applicant: Murata Manufacturing Co., Ltd., Kyoto (JP)

(72) Inventors: Satoshi Tanaka, Nagaokakyo (JP); Hirotsugu Mori, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/166,374

(22) Filed: Feb. 3, 2021

(65) Prior Publication Data

US 2021/0250054 A1    Aug. 12, 2021

(30) Foreign Application Priority Data

Feb. 7, 2020  (JP) .............................. JP2020-019552

(51) Int. Cl.
  *H04B 1/04*    (2006.01)
  *H03F 3/189*   (2006.01)
  *H04B 1/00*    (2006.01)

(52) U.S. Cl.
  CPC .............. *H04B 1/04* (2013.01); *H03F 3/189* (2013.01); *H04B 1/006* (2013.01);
  (Continued)

(58) Field of Classification Search
  CPC ........ H04B 1/04; H04B 1/0483; H04B 1/006; H04B 1/0064; H04B 1/0067;
  (Continued)

(56) References Cited

U.S. PATENT DOCUMENTS 8,204,452 B2 *  6/2012  Lin ..................... H04B 1/0483
                                                455/118
8,576,943 B2 * 11/2013  Kilambi .............. H04B 1/0475
                                                455/114.3

(Continued)

FOREIGN PATENT DOCUMENTS

JP   2008-503942 A   2/2008
JP   2019-087916 A   6/2019

OTHER PUBLICATIONS

Qualcomm Incorporated, Intra-band Contiguous ULCA MPR for FR1, 3GPP TSG-RAN WG4 Meeting, Oct. 14-18, 2019, pp. 1-7, R4-1912908, Qualcomm Incorporated, Chongqing, China.

*Primary Examiner* — Quochien B Vuong
(74) *Attorney, Agent, or Firm* — Pearne & Gordon LLP

(57) ABSTRACT

A radio frequency circuit includes: a first power amplifier capable of amplifying a first radio frequency signal and a second radio frequency signal each having a different frequency; and a second power amplifier capable of amplifying the second radio frequency signal. In a case where the first radio frequency signal and the second radio frequency signal are simultaneously transmitted, (i) under a condition that a sum of a bandwidth of the first radio frequency signal and a bandwidth of the second radio frequency signal is broader than or equal to a predetermined bandwidth, the first radio frequency signal is amplified by the first power amplifier, and the second radio frequency signal is amplified by the second power amplifier, and (ii) under a condition that the sum is narrower than the predetermined bandwidth, the first radio frequency signal and the second radio frequency signal are amplified by the first power amplifier.

14 Claims, 8 Drawing Sheets

(52) U.S. Cl.
CPC .. *H03F 2200/294* (2013.01); *H03F 2200/451* (2013.01); *H04B 2001/0408* (2013.01)

(58) Field of Classification Search
CPC .... H04B 2001/0408; H04B 2001/0416; H04B 2001/045; H03F 3/189; H03F 3/20; H03F 3/24; H03F 2200/249; H03F 2200/451
See application file for complete search history.

(56) References Cited

U.S. PATENT DOCUMENTS

| | | | |
|---|---|---|---|
| 9,397,614 B2* | 7/2016 | Lin | H04B 1/04 |
| 10,003,375 B2* | 6/2018 | Granger-Jones | H04B 1/0458 |
| 10,284,235 B2* | 5/2019 | Thompson | H04B 1/006 |
| 10,530,626 B2* | 1/2020 | Jia | H04B 1/0483 |
| 10,819,285 B1* | 10/2020 | Khlat | H04B 1/0475 |
| 2005/0281220 A1 | 12/2005 | Stanwood et al. | |
| 2014/0111178 A1 | 4/2014 | Khlat et al. | |

* cited by examiner

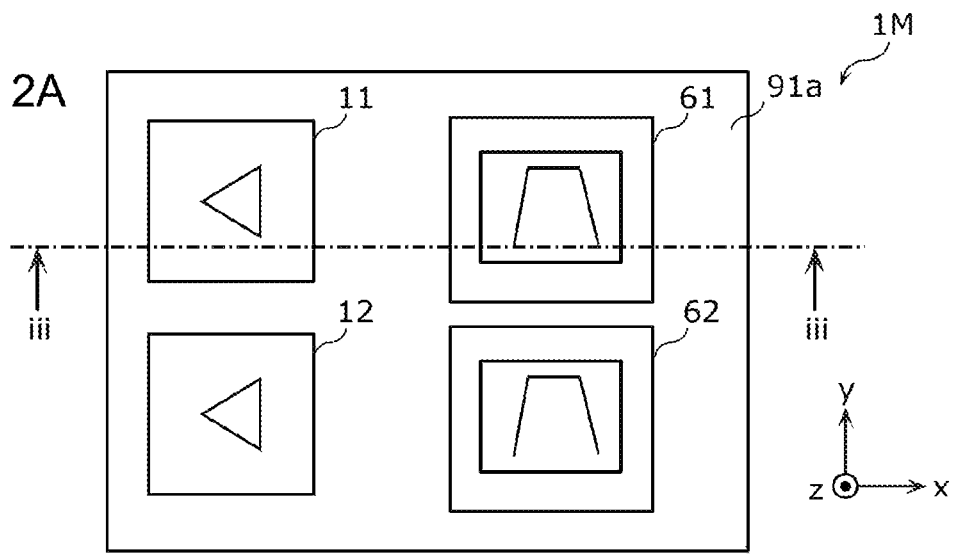
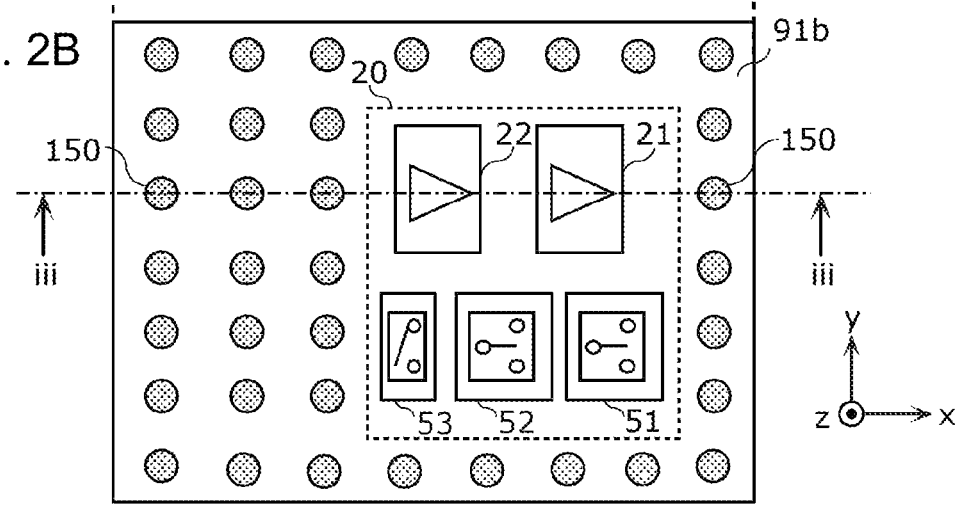

RADIO FREQUENCY CIRCUIT, RADIO FREQUENCY MODULE, AND COMMUNICATION DEVICE

CROSS REFERENCE TO RELATED APPLICATION

The present application is based on and claims priority of Japanese Patent Application No. 2020-019552 filed on Feb. 7, 2020. The entire disclosure of the above-identified application, including the specification, drawings and claims is incorporated herein by reference in its entirety.

TECHNICAL FIELD

The present disclosure relates to radio frequency circuits, radio frequency modules, and communication devices.

BACKGROUND

In the Third Generation Partnership Project (3GPP), the standardization of the Fifth Generation New Radio (5G NR) is proceeding, and a channel bandwidth selectable in each communication band is increasing, which makes it possible to select a broader channel bandwidth (see, for example, the specification of U.S. Patent Application Publication No. 2014/0111178).

BRIEF SUMMARY

However, when a radio frequency signal having a broader channel bandwidth is transmitted, the SN ratio of the radio frequency signal decreases. For this reason, a greater transmission power is required and a load on a power amplifier that amplifies a radio frequency signal increases. In addition, when radio frequency signals are simultaneously amplified, a load on the power amplifier further increases because a difference between a peak power and an average power of the signals to be amplified increases.

In view of this, the present disclosure provides a radio frequency circuit, a radio frequency module, and a communication device that can reduce an increase in load on a power amplifier when radio frequency signals are simultaneously transmitted.

A radio frequency circuit according to one aspect of the present disclosure includes: a first power amplifier capable of amplifying a first radio frequency signal and a second radio frequency signal each of which has a different frequency; and a second power amplifier capable of amplifying the second radio frequency signal. In a case where the first radio frequency signal and the second radio frequency signal are simultaneously transmitted, (i) under a condition that a sum of a bandwidth of the first radio frequency signal and a bandwidth of the second radio frequency signal is broader than or equal to a predetermined bandwidth, the first radio frequency signal is amplified by the first power amplifier, and the second radio frequency signal is amplified by the second power amplifier, and (ii) under a condition that the sum of the bandwidth of the first radio frequency signal and the bandwidth of the second radio frequency signal is narrower than the predetermined bandwidth, the first radio frequency signal and the second radio frequency signal are amplified by the first power amplifier.

A radio frequency module according to one aspect of the present disclosure includes: a first filter; a second filter; a first power amplifier connected to the first filter; and a second power amplifier connected to the second filter. The first filter, the second filter, the first power amplifier, and the second power amplifier are disposed on the same module substrate. The first filter and the second filter have passbands covering the same communication band.

The present disclosure makes it possible to reduce an increase in load on a power amplifier when radio frequency signals are simultaneously transmitted.

BRIEF DESCRIPTION OF DRAWINGS

These and other advantages and features will become apparent from the following description thereof taken in conjunction with the accompanying Drawings, by way of non-limiting examples of embodiments disclosed herein.

FIGS. 2A and 2B are plan views of the radio frequency module according to Embodiment 1.

DETAILED DESCRIPTION OF EMBODIMENTS

Figure 1:
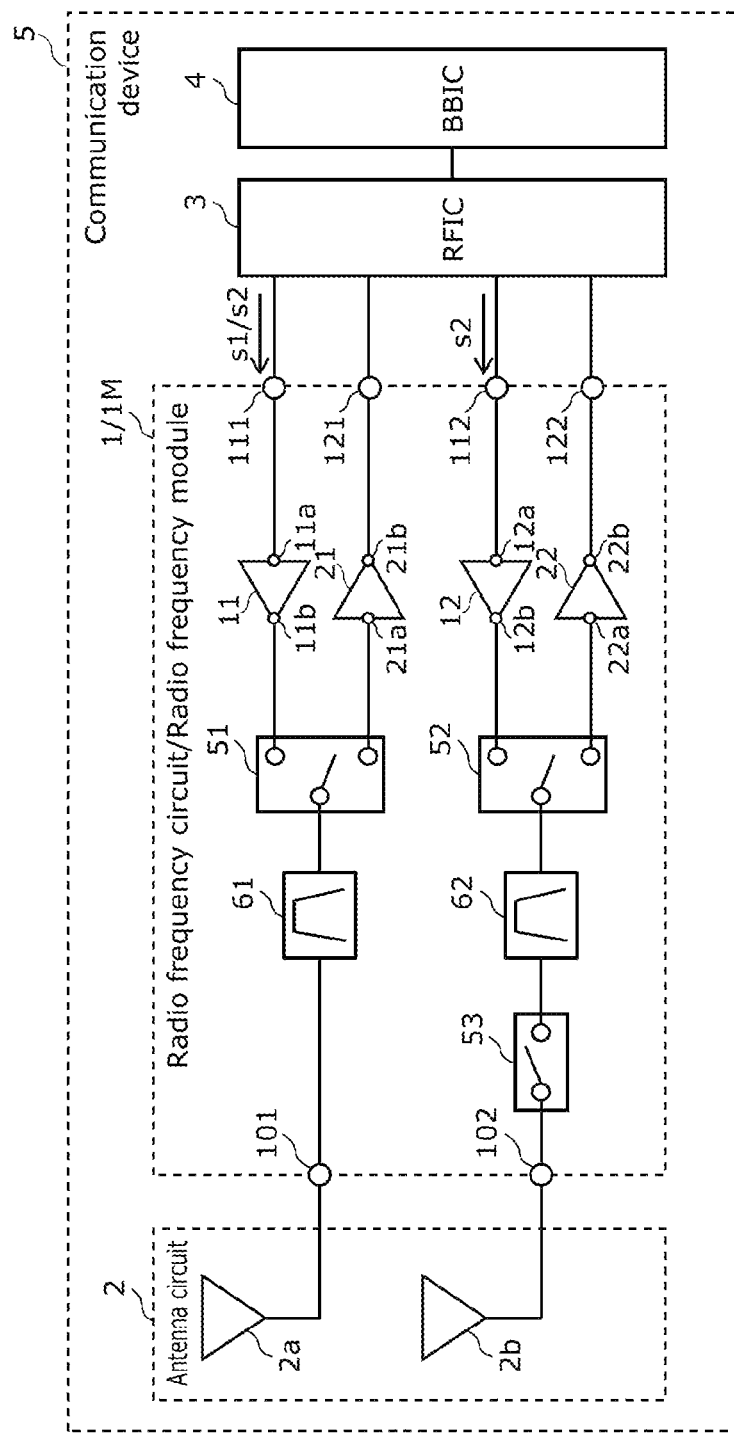
FIG. 1 is a circuit configuration diagram of a radio frequency circuit, a radio frequency module, and a communication device according to Embodiment 1.

Hereinafter, exemplary embodiments of the present disclosure will be described in detail with reference to the drawings. It should be noted that each of the subsequently described exemplary embodiments shows a generic or a specific example. The numerical values, shapes, materials, elements, the arrangement and connection of the elements, and others indicated in the following exemplary embodiments are mere examples, and therefore are not intended to limit the present disclosure.

Note that the drawings are schematic diagrams in which emphasis, omission, or ratio adjustment has been applied where necessary to illustrate the present disclosure. The drawings are thus not necessarily exact illustration of the present disclosure, and may illustrate shapes, positional relationships, and ratios differently from the actual ones. In the drawings, substantially the same structural elements are assigned the same reference marks, and their repetitive description may be omitted or simplified.

In a radio frequency circuit according to one aspect of the present disclosure, "connected" means not only a case where elements are directly connected via a connection terminal and/or a wiring conductor but also a case where elements are electrically connected via another circuit element. In addition, "connected between A and B" means connected to A and B on a path connecting A and B.

Moreover, in a radio frequency module according to one aspect of the present disclosure, the expression "a component is disposed on a substrate" includes not only a case where a component is disposed on top of a substrate but also a case where a component is disposed above a substrate (e.g., a component is placed on another component disposed on top of a substrate) and a case where part or all of a component is embedded in a substrate. Additionally, the expression "a component is disposed on a principal surface of a substrate" includes not only a case where a component is disposed on top of a principal surface of a substrate but also a case where a component is disposed above a principal surface of a substrate and a case where part or all of a component is embedded in a principal surface of a substrate.

Embodiment 1

1.1 Circuit Configurations of Radio Frequency Circuit 1 and Communication Device 5

The following describes circuit configurations of radio frequency circuit 1 and communication device 5 according to the present embodiment, with reference to FIG. 1. FIG. 1 is a circuit configuration diagram of radio frequency circuit 1 and communication device 5 according to Embodiment 1.

1.1.1 Circuit Configuration of Communication Device 5

As shown by FIG. 1, communication device 5 according to the present embodiment includes radio frequency circuit 1 (radio frequency module 1M), antenna circuit 2, RF signal processing circuit (RFIC) 3, and baseband signal processing circuit (BBIC) 4.

Radio frequency circuit 1 is an example of a radio frequency circuit that transfers a radio frequency signal processed by a signal processing circuit. Radio frequency circuit 1 transfers a radio frequency signal between antenna circuit 2 and RFIC 3. Specifically, radio frequency circuit 1 includes a transmission circuit that can simultaneously transmit first radio frequency signal s1 and second radio frequency signal s2, first radio frequency signal s1 and second radio frequency signal s2 having different frequencies. The detailed circuit configuration of radio frequency circuit 1 will be described later.

Antenna circuit 2 includes antenna elements 2a and 2b. Antenna element 2a is connected to antenna connection terminal 101 of radio frequency circuit 1 and transmits and/or receives first radio frequency signal s1 and/or second radio frequency signal s2. Antenna element 2b is connected to antenna connection terminal 102 of radio frequency circuit 1 and transmits and/or receives second radio frequency signal s2.

RFIC 3 is an example of a signal processing circuit that processes a radio frequency signal. Specifically, RFIC 3 performs, by the downconversion and the like, a signal processing on a radio frequency reception signal inputted via a reception path of radio frequency circuit 1, and outputs the reception signal generated by the signal processing to BBIC 4. Moreover, RFIC 3 performs, by the upconversion and the like, a signal processing on a transmission signal inputted from BBIC 4, and outputs the radio frequency transmission signal generated by the signal processing to a transmission path of radio frequency circuit 1. Furthermore, RFIC 3 controls switches, amplifiers, and the like of radio frequency circuit 1.

BBIC 4 is a baseband signal processing circuit that performs signal processing using an intermediate frequency band having a lower frequency than a radio frequency signal transferred by radio frequency circuit 1. The signal processed by BBIC 4 is used as, for example, an image signal for image display and/or a sound signal for conversation via a speaker.

It should be noted that in communication device 5 according to the present embodiment, antenna circuit 2 and BBIC 4 are not essential elements.

1.1.2 Circuit Configuration of Radio Frequency Circuit 1

The following describes the circuit configuration of radio frequency circuit 1 in detail with reference to FIG. 1. As shown by FIG. 1, radio frequency circuit 1 includes power amplifiers 11 and 12, low-noise amplifiers 21 and 22, switches 51, 52, and 53, filters 61 and 62, antenna connection terminals 101 and 102, transmission input terminals 111 and 112, and reception output terminals 121 and 122

Power amplifier 11 is an example of a first power amplifier, is capable of amplifying first radio frequency signal s1 and second radio frequency signal s2, and is connected to filter 61 via switch 51. Specifically, power amplifier 11 includes input terminal 11a connected to transmission input terminal 111, and output terminal 11b connected to filter 61 via switch 51.

Power amplifier 11 switches between the amplification of first radio frequency signal s1 and the amplification of first radio frequency signal s1 and second radio frequency signal s2, based on a bandwidth (hereinafter referred to as "first bandwidth") of first radio frequency signal s1 and a bandwidth (hereinafter referred to as "second bandwidth") of second radio frequency signal s2. Specifically, in the case where first radio frequency signal s1 and second radio frequency signal s2 are simultaneously transmitted, when the sum of the first bandwidth and the second bandwidth (hereinafter referred to as "a total bandwidth") is broader than or equal to a predetermined bandwidth, power amplifier 11 amplifies first radio frequency signal s1 without amplifying second radio frequency signal s2. On the other hand, when the total bandwidth is narrower than the predetermined bandwidth, power amplifier 11 amplifies both first radio frequency signal s1 and second radio frequency signal s2 at the same time. For example, when a total bandwidth is broader than or equal to a predetermined bandwidth, RFIC 3 inputs only first radio frequency signal s1 to transmission input terminal 111; and in other cases, RFIC 3 inputs both first radio frequency signal s1 and second radio frequency signal s2 to transmission input terminal 111.

Power amplifier 12 is an example of a second power amplifier, is capable of amplifying second radio frequency signal s2, and is connected to filter 62 via switch 52. Specifically, power amplifier 12 includes input terminal 12a connected to transmission input terminal 112, and output terminal 12b connected to filter 62 via switch 52.

Power amplifier 12 switches between the amplification and the non-amplification of second radio frequency signal s2, based on the first bandwidth and the second bandwidth. Specifically, power amplifier 12 amplifies second radio frequency signal s2 when a total bandwidth is broader than or equal to a predetermined bandwidth. On the other hand, power amplifier 12 does not amplify second radio frequency signal s2 when the total bandwidth is narrower than the predetermined bandwidth. For example, when a total bandwidth is broader than or equal to a predetermined bandwidth, RFIC 3 inputs second radio frequency signal s2 to transmission input terminal 112; and in other cases, RFIC 3 does not input second radio frequency signal 2s to transmission input terminal 112. It should be noted that when power amplifier 12 does not amplify second radio frequency signal s2, power amplifier 12 may be de-actuated or amplify another radio frequency signal.

As stated above, by power amplifier 11 amplifying first radio frequency signal s1 and power amplifier 12 amplifying second radio frequency signal s2 when the total bandwidth is broader than or equal to the predetermined bandwidth, power amplifiers 11 and 12 can support a high power class (e.g., Power Class 1.5 or 2) even when the total bandwidth is great.

A power class is a category for an output power of a terminal defined by the maximum output power and the like, and a smaller value of a power corresponds to a higher power output. The maximum output power is defined by output power at an antenna end of a terminal. The maximum output power is measured by, for example, a method defined by 3GPP and the like. For example, in FIG. 1, the maximum output power is measured by measuring a radiant power at antenna elements 2a and 2b. It should be noted that instead of a radiant power, the output power of antenna elements 2a and 2b can be measured when a terminal is provided in the vicinity of antenna elements 2a and 2b and a measuring instrument (e.g., a spectrum analyzer) is connected to the terminal.

The first bandwidth and the second bandwidth may be determined from, for example, a channel bandwidth used for transmitting first radio frequency signal s1 and second radio frequency signal s2. A channel bandwidth available for each radio frequency signal is defined in advance by a standards organization (e.g., 3GPP and Institute of Electrical and Electronics Engineers (IEEE)), for each communication system.

In LTE and 5G NR, one or more selectable channel bandwidths are defined in advance for each frequency band. For example, when channel bandwidths are defined for a frequency band for first radio frequency signal s1, one of the channel bandwidths is selected to transmit first radio frequency signal s1, based on traffic etc. The first bandwidth can be determined from the channel bandwidth selected in such a manner.

A predetermined bandwidth used for comparison to a total bandwidth is not particularly limited, and a bandwidth predetermined experimentally and/or empirically (e.g., 100 megahertz) can be used as a predetermined bandwidth.

Low-noise amplifier 21 is an example of a first low-noise amplifier and is connected to filter 61 via switch 51. Specifically, low-noise amplifier 21 includes input terminal 21a connected to filter 61 via switch 51, and output terminal 21b connected to reception output terminal 121. Low-noise amplifier 21 amplifies, with low noise, a third radio frequency signal having passed through filter 61.

Low-noise amplifier 22 is an example of a second low-noise amplifier and is connected to filter 62 via switch 52. Specifically, low-noise amplifier 22 includes input terminal 22a connected to filter 62 via switch 52, and output terminal 22b connected to reception output terminal 122. Low-noise amplifier 22 amplifies, with low noise, a fourth radio frequency signal having passed through filter 62.

Switch 51 is an example of a first switch and switches between connecting filter 61 and power amplifier 11 and connecting filter 61 and low-noise amplifier 21. Switch 51 is connected between (i) filter 61 and (ii) power amplifier 11 and low-noise amplifier 21. Specifically, switch 51 includes a common terminal connected to filter 61, and a first terminal and a second terminal connected to power amplifier 11 and low-noise amplifier 21, respectively. In such a connection configuration, switch 51 can connect one of the first terminal and the second terminal to the common terminal, based on, for example, a control signal from RFIC 3. Accordingly, time division duplex (TDD) is achieved by switching between connecting filter 61 and power amplifier 11 and connecting filter 61 and low-noise amplifier 21. Switch 51 includes, for example, a single-pole double-throw (SPDT) switch circuit.

Switch 52 is an example of a second switch and switches between connecting filter 62 and power amplifier 12 and connecting filter 62 and low-noise amplifier 22. Switch 52 is connected between (i) filter 62 and (ii) power amplifier 12 and low-noise amplifier 22. Specifically, switch 52 includes a common terminal connected to filter 62, and a first terminal and a second terminal connected to power amplifier 12 and low-noise amplifier 22, respectively. In such a connection configuration, switch 52 can connect one of the first terminal and the second terminal to the common terminal, based on, for example, a control signal from RFIC 3. Accordingly, TDD is achieved by switching between connecting filter 62 and power amplifier 12 and connecting filter 62 and low-noise amplifier 22. Switch 52 includes, for example, an SPDT switch circuit.

Switch 53 is an example of a third switch and switches between conduction and non-conduction of a transfer path for second radio frequency signal s2 to which power amplifier 12 is connected. In the present embodiment, switch 53 is connected between antenna connection terminal 102 and filter 62. Specifically, switch 53 includes a first terminal connected to antenna connection terminal 102, and a second terminal connected to filter 62. In such a connection configuration, switch 53 can switch between connecting and disconnecting between the first terminal and the second terminal, based on, for example, a control signal from RFIC 3. Accordingly, the conduction and non-conduction of the transfer path to which power amplifier 12 is connected is switched, thereby controlling the operation of power amplifier 12. For example, when switch 53 is turned off, power amplifier 12 is de-actuated. Switch 53 includes, for example, a single-pole double-throw (SPDT) switch circuit.

It should be noted that an arrangement and a configuration of switch 53 are not limited to the above. Switch 53 may be connected between filter 62 and power amplifier 12. In this case, switch 53 may be integrated with switch 52. In addition, switch 53 may be connected between power amplifier 12 and transmission input terminal 112.

Filter 61 has a passband corresponding to a communication band for first radio frequency signal s1 and a communication band for second radio frequency signal s2. To put it another way, filter 61 allows first radio frequency signal s1 and second radio frequency signal s2 to pass. In the present embodiment, filter 61 is connected between antenna connection terminal 101 and switch 51.

Filter 62 has a passband corresponding to the communication band for second radio frequency signal s2. To put it another way, filter 62 allows second radio frequency signal s2 to pass. In the present embodiment, filter 62 is connected between antenna connection terminal 102 and switch 52.

For example, when first radio frequency signal s1 and second radio frequency signal s2 have the same communication band, filters 61 and 62 have passbands covering the same communication band. Moreover, for example, when first radio frequency signal s1 and second radio frequency signal s2 each have different communication bands, filter 61 may have a passband corresponding to both the communication band for first radio frequency signal s1 and the communication band for second radio frequency signal s2, and filter 62 may have passbands covering only the communication band for second radio frequency signal s2. Accordingly, filter 62 can further attenuate unnecessary signal components and improve the S/N ratio of second radio frequency signal s2. It should be noted that both filters 61 and 62 may have passbands covering both the communication band for first radio frequency signal s1 and the communication band for second radio frequency signal s2.

It should be noted that the passbands of filter 61 and the passband of filter 62 need not overlap each other. For example, in the case where a frequency of each of allowable first radio frequency signal s1 and second radio frequency signal s2 when a total bandwidth of first radio frequency signal s1 and second radio frequency signal s2 is narrower than a predetermined bandwidth, and in the case where a frequency of allowable second radio frequency signal s2 when a total bandwidth of first radio frequency signal s1 and second radio frequency signal s2 is broader than or equal to the predetermined bandwidth, a high frequency end of the passband of filter 61 may be narrower than the predetermined frequency, and a low frequency end of the passband of filter 62 may be broader than or equal to the predetermined frequency.

Filters 61 and 62 each are achieved by, for example, an acoustic wave filter using surface acoustic waves (SAWs), an acoustic wave filter using bulk acoustic waves (BAWs), an LC resonance filter, a dielectric filter, or any combination of these. Filters 61 and 62, however, are not limited to those.

1.2 Specific Examples of First Radio Frequency Signal s1 and Second Radio Frequency Signal s2

The following describes specific examples of first radio frequency signal s1 and second radio frequency signal s2. First radio frequency signal s1 and second radio frequency signal s2 each are radio frequency (RF) signals used by a predetermined communication system, and an RF signal in a channel included in a predetermined communication band for the communication system.

Here, a communication system means a communication system established using a radio access technology (RAT). In the present embodiment, for example, a 5G NR system, an LTE system, a Wireless Local Area Network (WLAN) system, and the like can be used as a communication system, but the communication system is not limited to these.

Moreover, a communication band means a frequency band defined in advance by a standards organization (e.g., 3GPP, IEEE) and the like for a communication system.

Signals in mutually different channels included in the same communication band for the same communication system may be used as an example of first radio frequency signal s1 and second radio frequency signal s2. Here, a guard band may be, or need not be, provided between a channel for first radio frequency signal s1 and a channel for second radio frequency signal s2. Here, for example, n77 (3300 MHz to 4200 MHz) or n41 (2496 MHz to 2690 MHz) for 5G NR may be used as the same communication band for the same communication system. Simultaneous transmission of such first radio frequency signal s1 and second radio frequency signal s2 is referred to as intra-band carrier aggregation (CA).

Furthermore, for example, U-NII-5 (5925 MHz to 6425 MHz) for WLAN may be used as the same communication band for the same communication system.

In Japan, mobile network operators (MNOs) are assigned to n77 for 5G NR. For example, a first MNO is assigned to a band from 3600 MHz to 3700 MHz, a second MNO is assigned to a band from 3700 MHz to 3800 MHz, a third MNO is assigned to a band from 3800 MHz to 3900 MHz, a fourth MNO is assigned to a band from 3900 MHz to 4000 MHz, and the second MNO is also assigned to a band from 4000 MHz to 4100 MHz. In this case, intra-band CA can be used for the two bands to which the second MNO is assigned.

Moreover, signals in mutually different channels included in the same communication band for mutually different communication systems may be used as an example of first radio frequency signal s1 and second radio frequency signal s2. Here, for example, Band 41 (2496 MHz to 2690 MHz) for LTE or n41 (2496 MHz to 2690 MHz) for 5G NR may be used as the same communication band for the mutually different communication systems. Simultaneous transmission of such first radio frequency signal s1 and second radio frequency signal s2 is referred to as intra-band LTE-NR Dual Connectivity (EN-DC).

Additionally, for example, U-NII-5 (5925 MHz to 6425 MHz) for 5G NR or U-NII-5 for WLAN may be also used as the same communication band for the mutually different communication systems.

Furthermore, signals in mutually different communication bands for mutually different communication systems may be used as an example of first radio frequency signal s1 and second radio frequency signal s2. Here, Band 42 (3400 MHz to 3600 MHz) for LTE and n77 for 5G NR may be used as the mutually different communication bands for the mutually different communication systems. Moreover, Band 42 for LTE and n78 (3300 MHz to 3800 MHz) for 5G NR can be used, and Band 42 for LTE and n79 (4400 MHz to 5000 MHz) for 5G NR can be used. Furthermore, Band 38 (2570 MHz to 2620 MHz) for LTE and n41 (2496 MHz to 2690 MHz) for 5G NR can be used, and Band 41 (2496 MHz to 2690 MHz) for LTE and n38 (2570 MHz to 2620 MHz) for 5G NR can be also used. Simultaneous transmission of such first radio frequency signal s1 and second radio frequency signal s2 is referred to as intra-band EN-DC.

Additionally, for example, U-NII-2 (5250 MHz to 5725 MHz) for WLAN and n46 (5150 MHz to 5925 MHz) for 5G NR may be used as the mutually different communication bands for the mutually different communication systems.

Moreover, signals in mutually different communication bands for the same communication system may be used as an example of first radio frequency signal s1 and second radio frequency signal s2. Here, n77 (3300 MHz to 4200 MHz) and n78 (3300 MHz to 3800 MHz) for 5G NR can be used as the mutually different communication bands for the same communication system.

It should be noted that the specific communication systems and communication bands described above are examples, and the present disclosure is not limited to these communication systems and communication bands.

1.3 Layout of Circuit Components of Radio Frequency Module 1M

Figure 3:
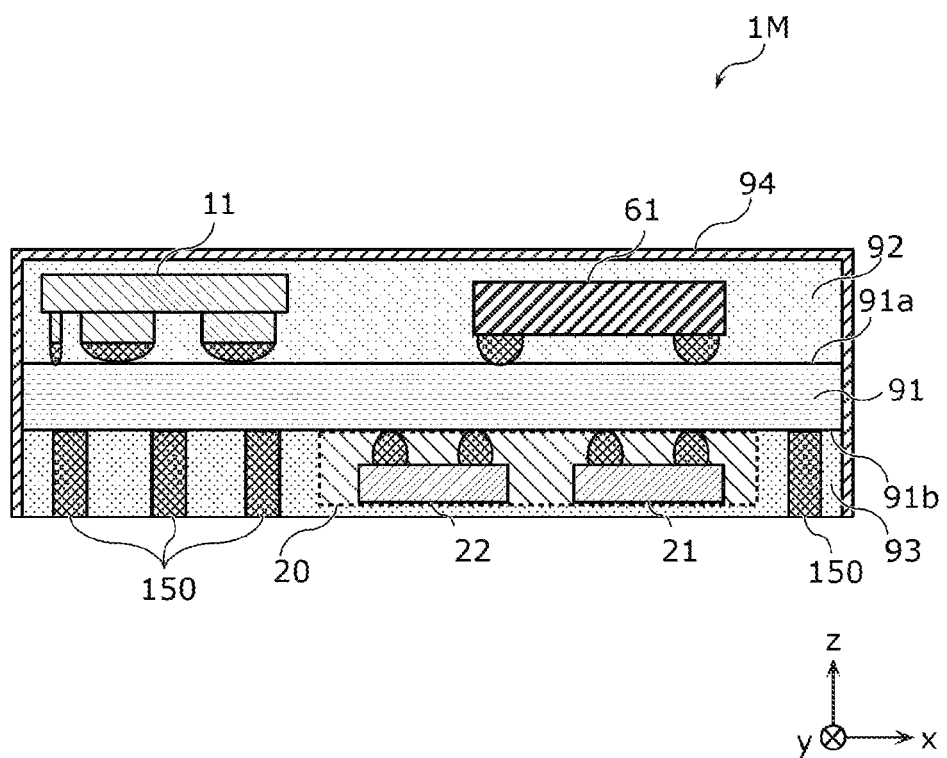
FIG. 3 is a cross-sectional view of the radio frequency module according to Embodiment 1.

The following describes in detail the layout of circuit components of radio frequency module 1M onto which radio frequency circuit 1 thus configured is mounted, with reference to FIGS. 2A and 2B and FIG. 3.

FIGS. 2A and 2B are plan views of radio frequency module 1M according to Embodiment 1. In FIG. 2A shows principal surface 91a of module substrate 91 seen from a z-axis positive side, and FIG. 2B shows principal surface 91b of module substrate 91 seen through from the z-axis positive side. FIG. 3 is a cross-sectional view of radio frequency module 1M according to Embodiment 1. The cross section of radio frequency module 1M in FIG. 3 is a cross section along line iii-iii in FIGS. 2A and 2B.

Although radio frequency module 1M is packaged with resin components 92 and 93 in the present embodiment, resin components 92 and 93 are omitted in FIGS. 2A and 2B so as to illustrate the circuit components.

As shown by FIGS. 2A and 2B and FIG. 3, radio frequency module 1 includes, in addition to circuit components containing the circuit elements shown by FIG. 1, semiconductor integrated circuit (IC) 20 containing low-noise amplifiers 21 and 22 and switches 51 to 53, module substrate 91, resin components 92 and 93, shield electrode layer 94, and post electrodes 150.

Module substrate 91 includes principal surface 91a and principal surface 91b that are opposite to each other. In the present embodiment, module substrate 91 is quadrilateral in a plan view. Although, for example, a printed circuit board (PCB), a low temperature co-fired ceramic substrate (LTCC), or a resin multi-layer board can be used as module substrate 91, module substrate 91 is not limited to these.

Principal surface 91a is an example of a first principal surface and may be referred to as an upper surface or a front surface. As shown by FIG. 2A, power amplifiers 11 and 12 and filters 61 and 62 are disposed on principal surface 91a.

Principal surface 91b is an example of a second principal surface and may be referred to as a lower surface or a rear surface. As shown by FIG. 2B, semiconductor IC 20 containing low-noise amplifiers 21 and 22 and switches 51 to 53, and post electrodes 150 are disposed on principal surface 91b.

Semiconductor IC 20 includes, for example, a complementary metal-oxide-semiconductor (CMOS), and is specifically configured using a silicon on insulator (SOI) structure. Accordingly, semiconductor IC 20 can be manufactured at low cost. It should be noted that semiconductor IC 20 may include at least one of GaAs, SiGe, or GaN. Accordingly, semiconductor IC 20 can output radio frequency signals having high quality amplification performance and noise performance.

Post electrodes 150 each are an example of an external connection terminal. Post electrodes 150 are disposed on principal surface 91b of module substrate 91 and extend vertically from principal surface 91b. In addition, post electrodes 150 penetrate through resin component 93, and the ends of post electrodes 150 are exposed from resin component 93. The ends of post electrodes 150 exposed from resin component 93 are connected to, for example, input-output terminals and/or ground electrodes on a mother board disposed on a z-axis negative side of radio frequency module 1M.

Resin component 92 is disposed on principal surface 91a of module substrate 91 and covers the circuit components on principal surface 91a. Similarly, resin component 93 is disposed on principal surface 91b of module substrate 91 and covers the circuit components on principal surface 91b. Resin components 92 and 93 have a function of ensuring reliability such as mechanical strengths and moisture resistances of the circuit components on principal surfaces 91a and 91b.

Shield electrode layer 94 covers an upper surface and a side surface of resin component 92, a side surface of module substrate 91, and a side surface of resin component 93. By being set to a ground potential, shield electrode layer 94 makes it possible to inhibit the infiltration of external noise into the circuit components included in radio frequency module 1M.

It should be noted that radio frequency module 1M need not include resin components 92 and 93 and shield electrode layer 94. To put it another way, resin components 92 and 93 and shield electrode layer 94 are not essential elements of a radio frequency module according to the present disclosure.

1.4 Operation of Communication Device 5

Figure 4:
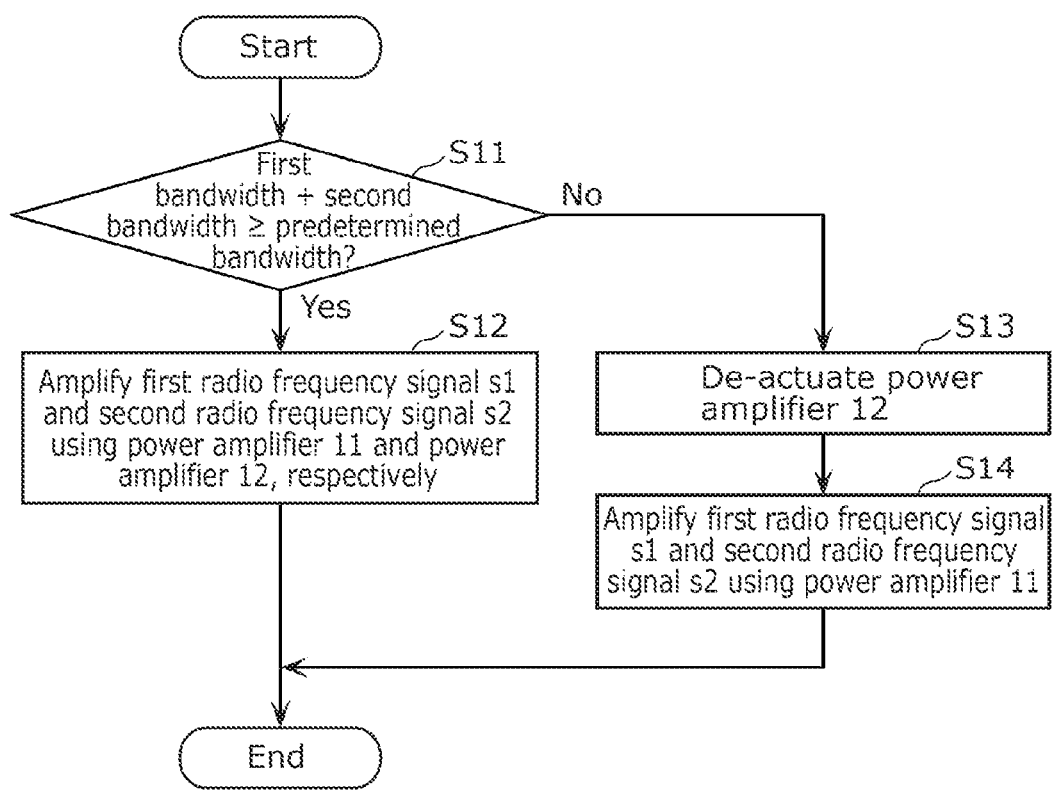
FIG. 4 is a flowchart illustrating operation of the communication device according to Embodiment 1.

The following describes operation of communication device 5 thus configured. FIG. 4 is a flowchart illustrating operation of communication device 5 according to Embodiment 1. Each step shown by FIG. 4 is performed by, for example, a controller (not shown) in RFIC 3. It should be noted that the controller may be included in radio frequency circuit 1.

First, it is determined whether the sum of a first bandwidth and a second bandwidth is broader than or equal to a predetermined threshold value (S11). Here, when the sum of the first bandwidth and the second bandwidth is broader than or equal to the predetermined threshold value (Yes in S11), power amplifier 1 amplifies first radio frequency signal s1, and power amplifier 12 amplifies second radio frequency signal s2 (S12). For example, RFIC 3 outputs first radio frequency signal s1 to transmission input terminal 111, and outputs second radio frequency signal s2 to transmission input terminal 112. Additionally, by controlling switches 51 to 53, RFIC 3 puts a transmission path connecting transmission input terminal 111 and antenna connection terminal 101 into a conduction state, and puts a transmission path connecting transmission input terminal 112 and antenna connection terminal 102 into the conduction state.

On the other hand, when the sum of the first bandwidth and the second bandwidth is narrower than the predetermined threshold value (No in S11), power amplifier 12 is de-actuated (S13). For example, by turning switch 53 off, RFIC 3 puts the transmission path connecting transmission input terminal 112 and antenna connection terminal 102 into a non-conduction state. After that, power amplifier 11 amplifies first radio frequency signal s1 and second radio frequency signal s2 (S14). For example, RFIC 3 outputs first radio frequency signal s1 and second radio frequency signal s2 together to transmission input terminal 111. Subsequently, by controlling switch 51, RFIC 3 puts the transmission path connecting transmission input terminal 111 and antenna connection terminal 101 into the conduction state.

As stated above, radio frequency circuit 1 according to the present embodiment includes: power amplifier 11 capable of amplifying radio frequency signal s1 and second radio frequency signal s2 each of which has a different frequency; and power amplifier 12 capable of amplifying second radio frequency signal s2. In a case where first radio frequency signal s1 and second radio frequency signal s2 are simultaneously transmitted, (i) under a condition that a sum of a bandwidth of first radio frequency signal s1 and a bandwidth of second radio frequency signal s2 is broader than or equal to a predetermined bandwidth, first radio frequency signal s1 is amplified by power amplifier 11, and second radio frequency signal s2 is amplified by power amplifier 12, and (ii) under a condition that the sum of the bandwidth of first radio frequency signal s1 and the bandwidth of second radio frequency signal s2 is narrower than the predetermined bandwidth, first radio frequency signal s1 and second radio frequency signal s2 are amplified by power amplifier 11.

Accordingly, when the sum of the bandwidth of first radio frequency signal s1 and the bandwidth of second radio frequency signal s2 is broader than or equal to the predetermined bandwidth, radio frequency circuit 1 allows mutually different power amplifiers 11 and 12 to amplify first radio frequency signal s1 and second radio frequency signal s2. For this reason, it is possible to reduce a decrease in signal-to-noise (SN) ratio due to an increase in bandwidth, and an accompanying increase in transmission power, and to reduce an increase in load on power amplifier 11, compared to a case in which only power amplifier 11 amplifies first radio frequency signal s1 and second radio frequency signal s2. On the other hand, when the sum of the bandwidth of first radio frequency signal s1 and the bandwidth of second radio frequency signal s2 is narrower than the predetermined bandwidth, radio frequency circuit 1 allows only power amplifier 11 to amplify first radio frequency signal s1 and second radio frequency signal s2. For this reason, it is possible to use power amplifier 12 for, for example, amplifying other radio frequency signals, and to use power amplifiers 11 and 12 more efficiently.

Moreover, for example, in radio frequency circuit 1 according to the present embodiment, first radio frequency signal s1 and second radio frequency signal s2 may be signals in mutually different channels included in a same communication band for a same communication system. In this case, the same communication band for the same communication system may be n77 or n41 for 5G NR.

Accordingly, when radio frequency signals in different channels included in the same communication band (e.g., n77 or n41 for 5G NR) for the same communication system are simultaneously transmitted, it is possible to use power amplifier 11 and power amplifier 12 efficiently while reducing an increase in load on power amplifier 11.

Moreover, for example, in radio frequency circuit 1 according to the present embodiment, first radio frequency signal s1 and second radio frequency signal s2 may be signals in mutually different communication bands for mutually different communication systems. In this case, the mutually different communication bands for the mutually different communication systems may include one of n77, n74, and n41 for 5G NR.

Accordingly, when radio frequency signals in mutually different communication bands (e.g., Band 42 for LTE and n77 for 5G NR) for mutually different communication systems are simultaneously transmitted, it is possible to use power amplifier 11 and power amplifier 12 efficiently while reducing an increase in load on power amplifier 11.

Moreover, for example, in radio frequency circuit 1 according to the present embodiment, first radio frequency signal s1 and second radio frequency signal s2 may be signals in mutually different communication bands for a same communication system. In this case, the mutually different communication bands for the same communication system may be n77 and n78 for 5G NR.

Accordingly, when radio frequency signals in mutually different communication bands (e.g., n77 and n78 for 5G NR) for the same communication system are simultaneously transmitted, it is possible to use power amplifier 11 and power amplifier 12 efficiently while reducing an increase in load on power amplifier 12.

Moreover, for example, in radio frequency circuit 1 according to the present embodiment, in the case where first radio frequency signal s1 and second radio frequency signal s2 are simultaneously transmitted, under the condition that the sum of the bandwidth of first radio frequency signal s1 and the bandwidth of second radio frequency signal s2 is narrower than the predetermined bandwidth, power amplifier 12 may de-actuated.

Accordingly, when power amplifier 11 amplifies first radio frequency signal s1 and second radio frequency signal s2, it is possible to de-actuate power amplifier 12 and reduce the power consumption of radio frequency circuit 1.

Moreover, for example, radio frequency circuit 1 according to the present embodiment may include switch 53 that switches between conduction and non-conduction in a transfer path to which power amplifier 12 is connected. In the case where first radio frequency signal s1 and second radio frequency signal s2 are simultaneously transmitted, under the condition that the sum of the bandwidth of first radio frequency signal s1 and the bandwidth of second radio frequency signal s2 is narrower than the predetermined bandwidth, power amplifier 12 may be de-actuated by switch 53 being turned off.

Accordingly, switch 53 makes it possible to de-actuate power amplifier 12, and it is possible to reduce the power consumption of radio frequency circuit 1 using a simpler configuration.

Moreover, for example, in radio frequency circuit 1 according to the present embodiment, in the case where first radio frequency signal s1 and second radio frequency signal s2 are simultaneously transmitted, under the condition that the sum of the bandwidth of first radio frequency signal s1 and the bandwidth of second radio frequency signal s2 is broader than or equal to the predetermined bandwidth, power amplifier 11 and power amplifier 12 may support Power Class 1.5 or 2.

Accordingly, since it is possible to reduce an increase in load on power amplifier 11 when the sum of the bandwidth of first radio frequency signal s1 and the bandwidth of second radio frequency signal s2 is broader than or equal to the predetermined bandwidth, it is possible to support Power Class 1.5 or 2. In particular, since the load on power amplifier 11 increases more in Power Class 1.5 or 2 than Power Class 3, the above configuration produces a greater effect on the load reduction.

Radio frequency module 1M according to the present embodiment includes: filter 61; filter 62; power amplifier including output terminal 11b connected to filter 61; and power amplifier 12 including output terminal 12b connected to filter 62. Filters 61 and 62 and power amplifiers 11 and 12 are disposed on module substrate 91. Filters 61 and 62 have passbands covering the same communication band.

Accordingly, radio frequency module 1M can include filters 61 and 62 having passbands covering the same communication band. For this reason, when first radio frequency signal s1 and second radio frequency signal s2 in the same communication band are simultaneously transmitted, different power amplifiers 11 and 12 are allowed to amplify first radio frequency signal s1 and second radio frequency signal s2, and it is possible to reduce an increase in load on power amplifier 11 or 12.

Moreover, for example, radio frequency module 1M may further include: low-noise amplifier 21 including input terminal 21a connected to filter 61; low-noise amplifier 22 including input terminal 22a connected to filter 62; switch 51 that switches between connecting filter 61 and power amplifier 11 and connecting filter 61 and low-noise amplifier 21; and switch 52 that switches between connecting filter 62 and power amplifier 112 and connecting filter 62 and low-noise amplifier 22.

Accordingly, radio frequency module 1M can be used for transmitting and receiving a radio frequency signal in a communication band to which TDD is applied.

Moreover, for example, in radio frequency module 1M, module substrate 91 may include principal surface 91a and principal surface 91b that are opposite to each other, power amplifiers 11 and 12 and filters 61 and 62 may be disposed on principal surface 91a of module substrate 91, and low-noise amplifiers 21 and 22 and switches 51 and 52 may be disposed on principal surface 91b of module substrate 91.

Accordingly, it is possible to dispose components on the both surfaces of module substrate 91 and downsize radio frequency module 1M. In addition, it is possible to dispose power amplifiers 11 and 12 and low-noise amplifiers 21 and 22 on the opposite principal surfaces, and to improve isolation characteristics between transmission and reception.

Moreover, for example, radio frequency module 1M may further include post electrode 150 as an external connection terminal on principal surface 91b of module substrate 91.

Accordingly, it is possible to dispose power amplifiers 11 and 12 on the principal surface opposite to the external connection terminal, and to improve heat dissipation of power amplifiers 11 and 12 that generate a large amount of heat.

Moreover, for example, radio frequency module 1M may further include switch 53 that switches between conduction and non-conduction in a path connecting power amplifier 12 and filter 62. Switch 53 may be disposed on principal surface 91b of module substrate 91.

Accordingly, switch 53 makes it possible to de-actuate power amplifier 12, and it is possible to reduce the power consumption of radio frequency module 1M using a simpler configuration.

Moreover, for example, in radio frequency module 1M according to the present embodiment, the same communication band may be n77 or n41 for 5G NR.

Accordingly, radio frequency module 1M capable of simultaneously transmitting radio frequency signals in different channels included in n77 or n41 for 5G NR can produce the above-mentioned advantageous effects.

Communication device 5 according to the present embodiment includes: RFIC 3 that processes a radio frequency signal; and radio frequency circuit 1 or radio frequency module 1M that transfers the radio frequency signal processed by RFIC 3.

Accordingly, communication device 5 can produce the same advantageous effects as radio frequency circuit 1 or radio frequency module 1M described above.

Embodiment 2

Next, Embodiment 2 will be described. The present embodiment differs from Embodiment 1 mainly in a means of de-actuating power amplifier 12. The following describes the present embodiment with reference to the drawings, mainly focusing on differences from Embodiment 1.

Figure 5:
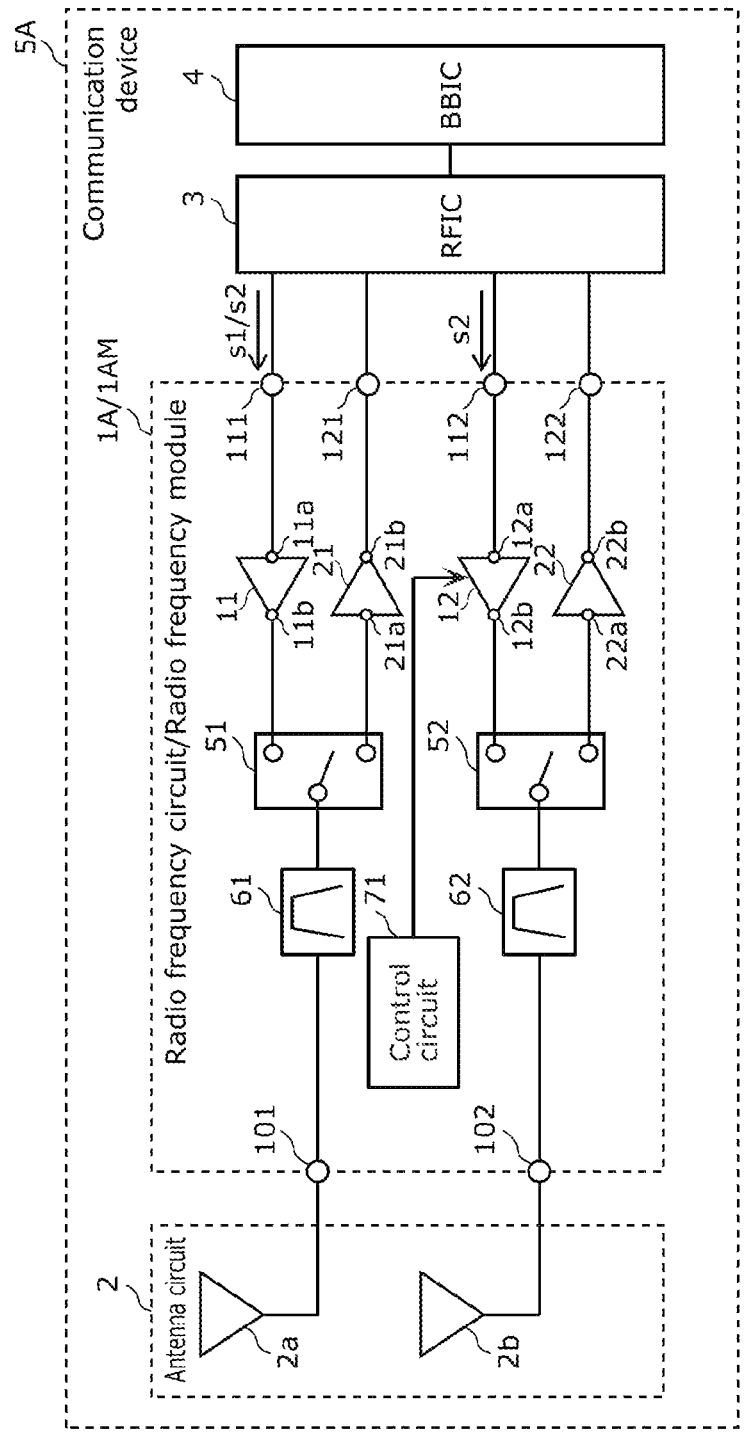
FIG. 5 is a circuit configuration diagram of a radio frequency circuit, a radio frequency module, and a communication device according to Embodiment 2.

2.1 Circuit Configurations of Radio Frequency Circuit 1A and Communication Device 5A The following describes circuit configurations of radio frequency circuit 1A and communication device 5A according to the present embodiment, with reference to FIG. 5. FIG. 5 is a circuit configuration diagram of radio frequency circuit 1A and communication device 5A according to Embodiment 2.

2.1.1 Circuit Configuration of Radio Frequency Circuit 1A

As shown by FIG. 5, radio frequency circuit 1A includes power amplifiers 11 and 12, low-noise amplifiers 21 and 22, switches 51 and 52, filters 61 and 62, control circuit 71, antenna connection terminals 101 and 102, transmission input terminals 111 and 112, and reception output terminals 121 and 122.

Control circuit 71 controls supply of at least one of a bias signal or power supply voltage to power amplifier 12. Specifically, in the case where first radio frequency signal s1 and second radio frequency signal s2 are simultaneously transmitted, when a total bandwidth is narrower than a predetermined bandwidth, control circuit 71 de-actuates power amplifier 12 by stopping the supply of at least one of the bias signal or the power supply voltage to power amplifier 12.

On the other hand, in the case where first radio frequency signal s1 and second radio frequency signal s2 are simultaneously transmitted, when a total bandwidth is broader than or equal to a predetermined bandwidth, control circuit 71 does not stop the supply of at least one of the bias signal or the power supply voltage to power amplifier 12. In other words, both the bias signal and the power supply voltage are supplied to power amplifier 12.

Control circuit 71 may control a supply of at least one of a bias signal or power supply voltage to power amplifier 11. For example, in the case where first radio frequency signal s1 and second radio frequency signal s2 are simultaneously transmitted, (i) control circuit 71 may supply a first bias signal when a total bandwidth is narrower than a predetermined bandwidth, and (ii) control circuit 71 may supply a second bias signal different from the first bias signal when the total bandwidth is broader than or equal to the predetermined bandwidth. Moreover, for example, in the case where first radio frequency signal s1 and second radio frequency signal s2 are simultaneously transmitted, (i) control circuit 71 may apply a first power supply voltage when a total bandwidth is narrower than a predetermined bandwidth, and (ii) control circuit 71 may apply a second power supply voltage different from the first power supply voltage when the total bandwidth is broader than or equal to the predetermined bandwidth.

Figure 6:
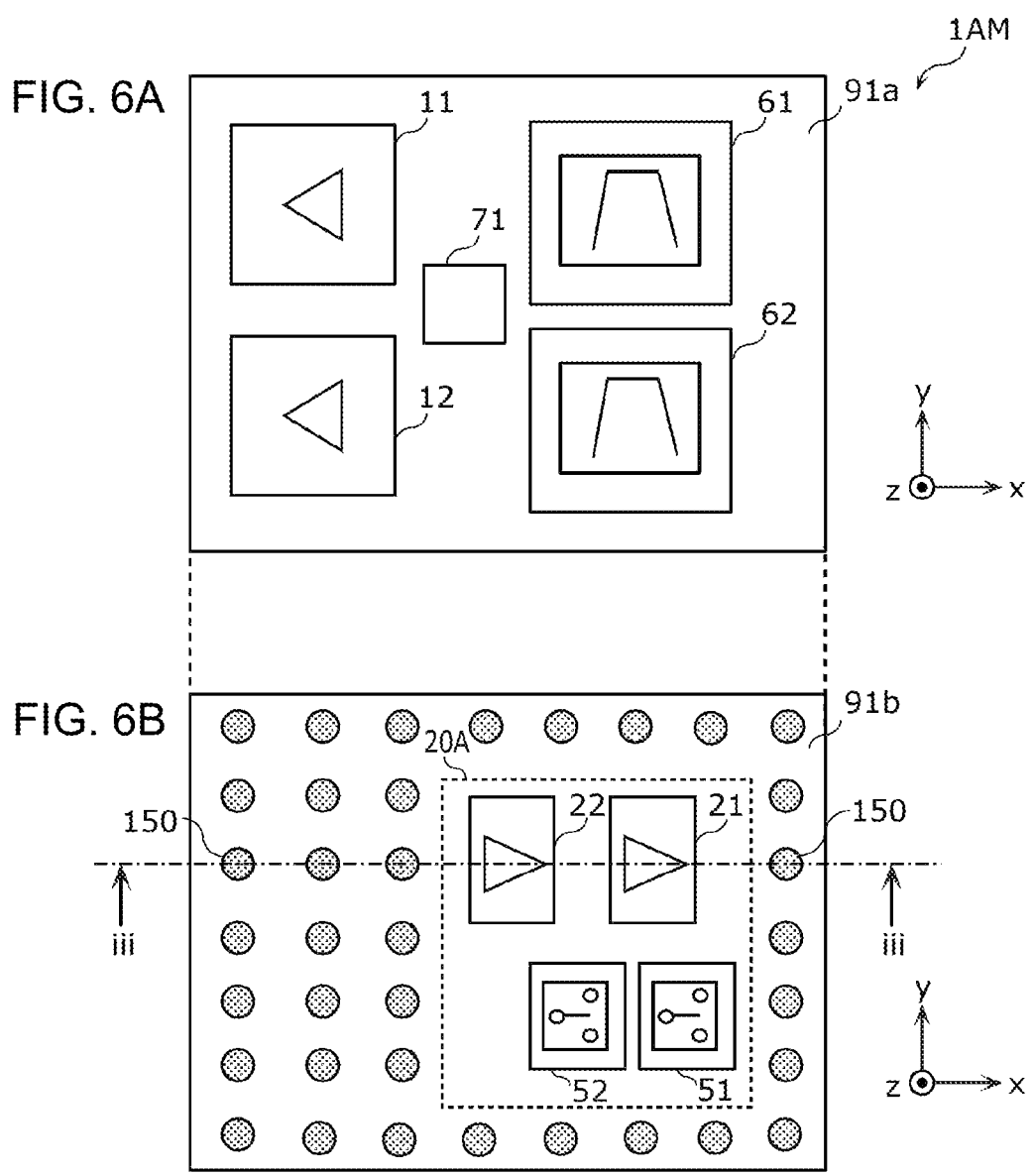
FIGS. 6A and 6B are plan views of the radio frequency module according to Embodiment 2.

It should be noted that a bias signal may be either one of bias current and bias voltage. 2.2 Layout of Circuit Components of Radio Frequency Module 1AM The following describes in detail the layout of circuit components of radio frequency module 1AM onto which radio frequency circuit 1A thus configured is mounted, with reference to FIGS. 6A and 6B.

FIGS. 6A and 6B are plan views of radio frequency module 1AM according to Embodiment 2. In FIG. 6A shows principal surface 91a of module substrate 91 seen from a z-axis positive side, and FIG. 6B shows principal surface 91b of module substrate 91 seen through from the z-axis positive side.

Although radio frequency module 1AM is packaged with resin components 92 and 93 in the present embodiment, resin components 92 and 93 are omitted in FIGS. 6A and 6B so as to illustrate the circuit components.

As shown by FIGS. 6A and 6B, radio frequency module 1AM includes, in addition to circuit components containing the circuit elements shown by FIG. 5, semiconductor IC 20A containing low-noise amplifiers 21 and 22 and switches 51 and 52, module substrate 91, resin components 92 and 93, shield electrode layer 94, and post electrodes 150.

As shown by FIG. 6A, power amplifiers 11 and 12, filters 61 and 62, and control circuit 71 are disposed on principal surface 91a of module substrate 91. It should be noted that control circuit 71 may be disposed on principal surface 91b.

As shown by FIG. 6B, semiconductor IC 20A containing low-noise amplifiers 21 and 22 and switches 51 and 52, and post electrodes 150 are disposed on principal surface 91b of module substrate 91.

As stated above, radio frequency circuit 1A according to the present embodiment includes control circuit 71 that controls supply of at least one of a bias signal or power supply voltage to power amplifier 12. In the case where first radio frequency signal s1 and second radio frequency signal s2 are simultaneously transmitted, under the condition that the sum of the bandwidth of first radio frequency signal s1 and the bandwidth of second radio frequency signal s2 is narrower than the predetermined bandwidth, control circuit 71 de-actuates power amplifier 12 by stopping the supply of at least one of the bias signal or the power supply voltage to power amplifier 12.

Accordingly, it is possible to de-actuate power amplifier 12 by stopping the supply of at least one of the bias signal or the power supply voltage, and to reduce the power consumption of radio frequency circuit 1A.

Moreover, for example, radio frequency circuit 1A according to the present embodiment may include control circuit 71 that controls supply of a bias signal to power amplifier 11. In the case where first radio frequency signal s1 and second radio frequency signal s2 are simultaneously transmitted, (i) under a condition that the sum of the bandwidth of first radio frequency signal s1 and the bandwidth of second radio frequency signal s2 is narrower than the predetermined bandwidth, control circuit 71 may supply a first bias signal to power amplifier 11, and (ii) under a condition that the sum of the bandwidth of first radio frequency signal s1 and the bandwidth of second radio frequency signal s2 is broader than or equal to the predetermined bandwidth, control circuit 71 may supply a second bias signal to power amplifier 11, the second bias signal being different from the first bias signal.

Accordingly, it is possible to supply a different bias signal to power amplifier 11 between when one radio frequency signal is amplified and when two radio frequency signals are amplified, and it is possible to supply a bias signal more suitable for a radio frequency signal to be amplified. As a result, it is possible to increase the power efficiency of power amplifier 11 and/or improve the quality of an amplified radio frequency signal.

Moreover, for example, radio frequency circuit 1A according to the present embodiment may include control circuit 71 that controls supply of power supply voltage to power amplifier 11. In the case where first radio frequency signal s1 and second radio frequency signal s2 are simultaneously transmitted, (i) under a condition that the sum of the bandwidth of first radio frequency signal s1 and the bandwidth of second radio frequency signal s2 is narrower than the predetermined bandwidth, control circuit 71 may supply a first power supply voltage to power amplifier 11, and (ii) under a condition that the sum of the bandwidth of first radio frequency signal s1 and the bandwidth of second radio frequency signal s2 is broader than or equal to the predetermined bandwidth, control circuit 71 may supply a second power supply voltage to power amplifier 11, the second power supply voltage being different from the first power supply voltage.

Accordingly, it is possible to apply different power supply voltage to power amplifier 11 between when one radio frequency signal is amplified and when two radio frequency signals are amplified, and it is possible to apply power supply voltage more suitable for a radio frequency signal to be amplified. As a result, it is possible to increase the power efficiency of power amplifier 11 and/or improve the quality of an amplified radio frequency signal.

Other Embodiments

Although the radio frequency circuit, the radio frequency module, and the communication device according to the present disclosure have been described above based on the aforementioned embodiments, the radio frequency circuit, the radio frequency module, and the communication device according to the present disclosure are not limited to the aforementioned embodiments. The present disclosure also includes other embodiments achieved by combining any of the elements in the aforementioned embodiments, variations resulting from various modifications to the aforementioned embodiments that may be conceived by those skilled in the art without departing from the essence of the present disclosure, and various devices that contain the radio frequency circuit and the communication device described above.

For example, the radio frequency module according to each of the aforementioned embodiments includes the post electrodes as the external connection terminals, the present disclosure is not limited to this. For example, the radio frequency module may include bump electrodes instead of the post electrodes. Such a radio frequency module will be described with reference to FIG. 7.

Figure 7:
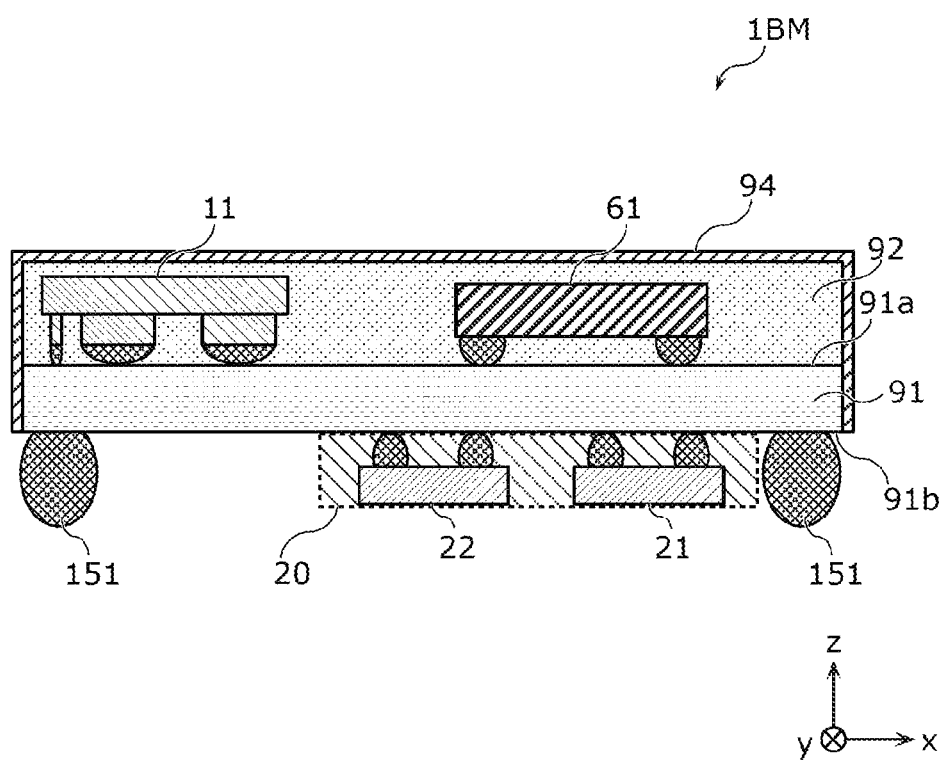
FIG. 7 is a cross-sectional view of a radio frequency module according to another embodiment.

FIG. 7 is a cross-sectional view of radio frequency module 1BM according to another embodiment. As shown by FIG. 7, radio frequency module 1BM includes bump electrodes 151 instead of post electrodes 150. Bump electrodes 151 each are an example of an external connection terminal. Bump electrodes 151 are disposed on principal surface 91b of module substrate 91, and are connected to, for example, input-output terminals and/or ground electrodes on a mother board disposed on a z-axis negative side of radio frequency module 1BM.

Moreover, as shown by FIG. 7, radio frequency module 1BM includes no resin component that covers the circuit components on principal surface 91b.

It should be noted that in the circuit configurations of the radio frequency circuit, the radio frequency module, and the communication device according to each of the aforementioned embodiments, any circuit element, any line, etc. may be inserted in a path connecting the circuit elements and signal paths shown by the figure. For example, as shown by FIG. 8, a new switch may be inserted in a radio frequency circuit.

Figure 8:
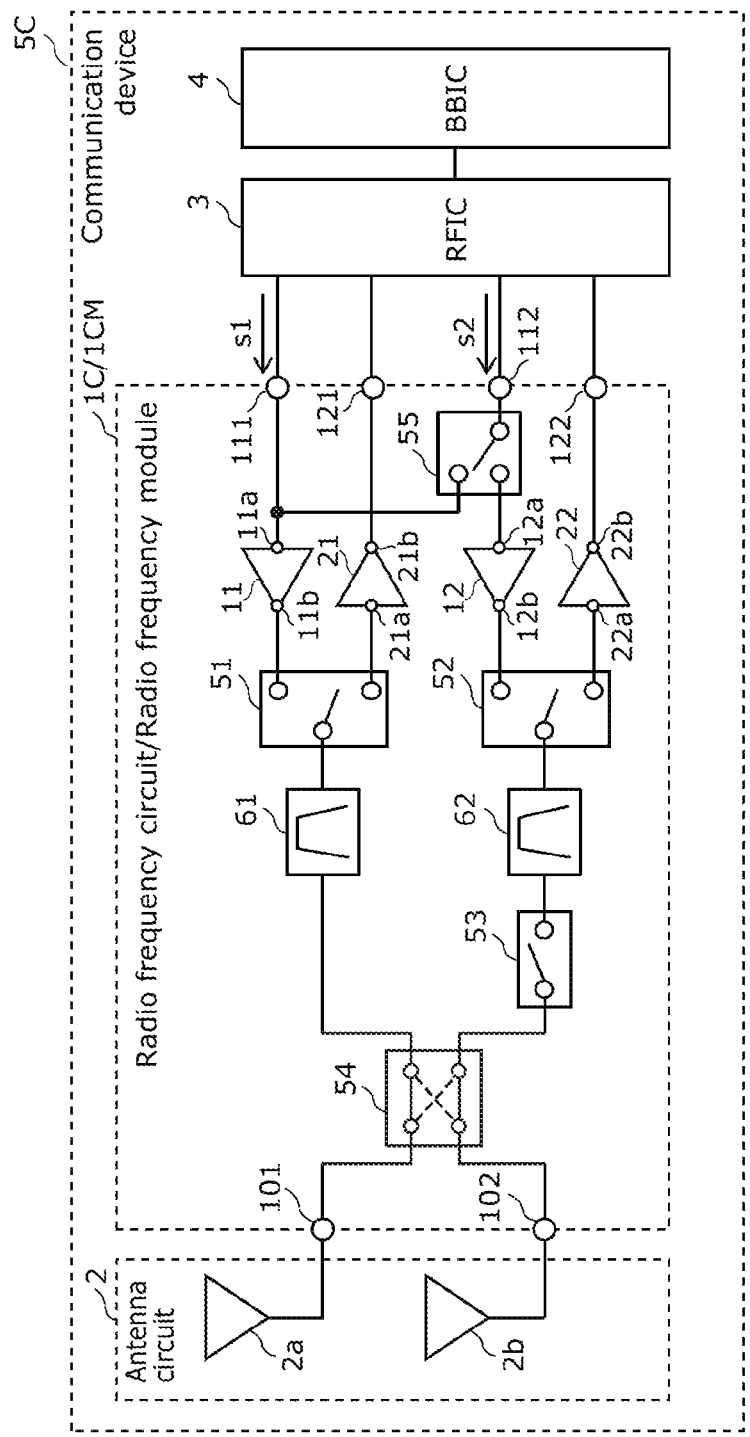
FIG. 8 is a circuit configuration diagram of a radio frequency circuit, a radio frequency module, and a communication device according to another embodiment.

FIG. 8 is a circuit configuration diagram of radio frequency circuit 1C, radio frequency module 1CM, and communication device 5C according to another embodiment. Radio frequency circuit 1C includes switches 54 and 55. It should be noted that radio frequency circuit 1C need not include both switches 54 and 55, and may include only one of switches 54 and 55.

Switch 54 is connected between (i) antenna connection terminals 101 and 102 and (ii) filter 61 and switch 53. Switch 54 connects power amplifier 11 to one of antenna elements 2a and 2b, and connects power amplifier 12 to one of antenna elements 2a and 2b. Specifically, switch 54 includes a first terminal connected to antenna connection terminal 101, a second terminal connected to antenna connection terminal 102, a third terminal connected to filter 61, and a fourth terminal connected to switch 53. In such a connection configuration, switch 54 can connect the first terminal to one of the third terminal and the fourth terminal, and connect the second terminal to one of the third terminal and the fourth terminal, based on, for example, a control signal from RFIC 3. Accordingly, it is possible to switch antenna elements 2a and 2b connected to power amplifiers 11 and 12, according to, for example, radio wave conditions. Switch 54 includes, for example, a multi-connection switch circuit. It should be noted that switch 53 may be integrated with switch 54.

Switch 55 is connected between (i) transmission input terminal 112 and (ii) power amplifiers 11 and 12. Switch 55 switches between connecting transmission input terminal 112 and power amplifier 11 and connecting transmission input terminal 112 and power amplifier 12. Specifically, switch 55 includes a common terminal connected to transmission input terminal 112, a first terminal connected to power amplifier 11, and a second terminal connected to power amplifier 12. In such a connection configuration, switch 55 can connect one of the first terminal and the second terminal to the common terminal, based on, for example, a control signal from RFIC 3. Accordingly, when the sum of a first bandwidth and a second bandwidth is narrower than a predetermined threshold value, switch 55 can connect transmission input terminal 112 to power amplifier 11; and when the sum of the first bandwidth and the second bandwidth is broader than or equal to the predetermined threshold value, switch 55 can connect transmission input terminal 112 to power amplifier 12. For this reason, even when the input of second radio frequency signal s2 is limited to transmission input terminal 112, switch 55 makes it possible to produce the same advantageous effects as Embodiment 1. Switch 55 includes, for example, an SPDT switch circuit.

In radio frequency module 1CM, switches 54 and 55 may be disposed on either one of principal surfaces 91a and 91b.

It should be noted that although TDD is used as a duplex mode in each of the aforementioned embodiments, the present disclosure is not limited to this. For example, frequency division duplex (FDD) may be used. In this case, a radio frequency circuit and a radio frequency module may include a duplexer instead of switches 51 and 52 and filters 61 and 62. In addition, for example, Band 71 (uplink: 663 MHz to 698 MHz, downlink: 617 MHz to 652 MHz) for LTE and n71 (uplink: 663 MHz to 698 MHz, downlink: 617 MHz to 652 MHz) for 5G NR may be used as communication bands. Additionally, Band 11 (1427.9 MHz to 1447.9 MHz) or Band 21 (1447.9 MHz to 1462.9 MHz) for LTE and n74 (1427 MHz to 1470 MHz) for 5G NR may be used.

It should be noted that although antenna circuit 2 includes antenna elements 2a and 2b in each of the aforementioned embodiments, the present disclosure is not limited to this. For example, antenna circuit 2 may include only one antenna element. In this case, filters 61 and 62 are connected to an antenna connection terminal connected to the antenna element. Here, filters 61 and 62 may be connected to the antenna connection terminal via a switch.

It should be noted that the radio frequency module is packaged with the resin components in each of the aforementioned embodiments, the present disclosure is not limited to this. For example, the radio frequency module need not be packaged. Besides, the radio frequency module may be packaged with components different from the resin components.

It should be noted that although the radio frequency circuit includes both the transmission path and the reception path in each of the aforementioned embodiments, the present disclosure is not limited to this. For example, the radio frequency circuit need not include the reception path. In this case, the radio frequency circuit need not include low-noise amplifiers 21 and 22, switches 51 and 52, and reception output terminals 121 and 122.

It should be noted that the layout (FIGS. 2A and 2B, FIG. 3, FIGS. 6A and 6B) of the components on module substrate 91 described in each of the aforementioned embodiments is an example, and the present disclosure is not limited to this. For example, one or more of the components disposed on principal surface 91a may be switched with one or more of the components disposed on principal surface 91b.

It should be noted that a detailed configuration of each of the power amplifiers has not been particularly described in each of the aforementioned embodiments, and the configuration of the power amplifier is not particularly limited. For example, the power amplifier may include amplifiers connected in multiple stages and/or a differential amplifier.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

The present disclosure can be widely used in communication apparatuses such as a mobile phone, as a radio frequency circuit disposed in a front end part.

The invention claimed is:

1. A radio frequency circuit, comprising:
a first power amplifier configured to amplify a first radio frequency signal and a second radio frequency signal each of which has a different frequency; and
a second power amplifier configured to amplify the second radio frequency signal,
wherein in a case where the first radio frequency signal and the second radio frequency signal are simultaneously transmitted,
(i) under a condition that a sum of a bandwidth of the first radio frequency signal and a bandwidth of the second radio frequency signal is broader than or equal to a predetermined bandwidth, the first radio frequency signal is amplified by the first power amplifier, and the second radio frequency signal is amplified by the second power amplifier, and
(ii) under a condition that the sum of the bandwidth of the first radio frequency signal and the bandwidth of the second radio frequency signal is narrower than the predetermined bandwidth, the first radio frequency signal and the second radio frequency signal are amplified by the first power amplifier.

2. The radio frequency circuit according to claim 1, wherein the first radio frequency signal and the second radio frequency signal are signals in mutually different channels included in a same communication band for a same communication system.

3. The radio frequency circuit according to claim 2, wherein the same communication band for the same communication system is n77 or n41 for the Fifth Generation New Radio (5G NR).

4. The radio frequency circuit according to claim 1, wherein the first radio frequency signal and the second radio frequency signal are signals in mutually different communication bands for mutually different communication systems.

5. The radio frequency circuit according to claim 4, wherein the mutually different communication bands for the mutually different communication systems include one of n77, n74, or n41 for 5G NR.

6. The radio frequency circuit according to claim 1, wherein the first radio frequency signal and the second radio frequency signal are signals in mutually different communication bands for a same communication system.

7. The radio frequency circuit according to claim 6, wherein the mutually different communication bands for the same communication system are n77 and n78 for 5G NR.

8. The radio frequency circuit according to claim 1, wherein in the case where the first radio frequency signal and the second radio frequency signal are simultaneously transmitted, under the condition that the sum of the bandwidth of the first radio frequency signal and the bandwidth of the second radio frequency signal is narrower than the predetermined bandwidth, the second power amplifier is de-actuated.

9. The radio frequency circuit according to claim 8, further comprising:
- a third switch configured to switch between conduction and non-conduction in a transfer path to which the second power amplifier is connected,
- wherein in the case where the first radio frequency signal and the second radio frequency signal are simultaneously transmitted, under the condition that the sum of the bandwidth of the first radio frequency signal and the bandwidth of the second radio frequency signal is narrower than the predetermined bandwidth, the second power amplifier is de-actuated by the third switch being turned off.

10. The radio frequency circuit according to claim 8, further comprising:
- a control circuit configured to control a supply of at least one of a bias signal or power supply voltage to the second power amplifier,
- wherein in the case where the first radio frequency signal and the second radio frequency signal are simultaneously transmitted, under the condition that the sum of the bandwidth of the first radio frequency signal and the bandwidth of the second radio frequency signal is narrower than the predetermined bandwidth, the control circuit de-actuates the second power amplifier by stopping the supply of at least one of the bias signal or the power supply voltage to the second power amplifier.

11. The radio frequency circuit according to claim 1, further comprising:
- a control circuit configured to control a supply of a bias signal to the first power amplifier,
- wherein in the case where the first radio frequency signal and the second radio frequency signal are simultaneously transmitted, (i) under a condition that the sum of the bandwidth of the first radio frequency signal and the bandwidth of the second radio frequency signal is narrower than the predetermined bandwidth, the control circuit supplies a first bias signal to the first power amplifier, and (ii) under a condition that the sum of the bandwidth of the first radio frequency signal and the bandwidth of the second radio frequency signal is broader than or equal to the predetermined bandwidth, the control circuit supplies a second bias signal to the first power amplifier, the second bias signal being different from the first bias signal.

12. The radio frequency circuit according to claim 1, further comprising:
- a control circuit configured to control a supply of power supply voltage to the first power amplifier,
- wherein in the case where the first radio frequency signal and the second radio frequency signal are simultaneously transmitted, (i) under a condition that the sum of the bandwidth of the first radio frequency signal and the bandwidth of the second radio frequency signal is narrower than the predetermined bandwidth, the control circuit applies a first power supply voltage to the first power amplifier, and (ii) under a condition that the sum of the bandwidth of the first radio frequency signal and the bandwidth of the second radio frequency signal is broader than or equal to the predetermined bandwidth, the control circuit applies a second power supply voltage to the first power amplifier, the second power supply voltage being different from the first power supply voltage.

13. The radio frequency circuit according to claim 1, wherein in the case where the first radio frequency signal and the second radio frequency signal are simultaneously transmitted, under the condition that the sum of the bandwidth of the first radio frequency signal and the bandwidth of the second radio frequency signal is greater than or equal to the predetermined bandwidth, the first power amplifier and the second power amplifier support Power Class 1.5 or 2.

14. A communication device, comprising:
- a signal processing circuit configured to process a radio frequency signal; and
- the radio frequency circuit according to claim 1 that transfers the radio frequency signal processed by the signal processing circuit.

* * * * *